United States Patent
Hazelton

(10) Patent No.: US 6,960,918 B2
(45) Date of Patent: Nov. 1, 2005

(54) METHOD AND APPARATUS FOR CONTROL AND FAULT DETECTION OF A REMOTE ELECTRICAL MOTOR

(75) Inventor: Lawrence Dean Hazelton, Goodrich, MI (US)

(73) Assignee: Delphi Technologies, Inc., Troy, MI (US)

( * ) Notice: Subject to any disclaimer, the term of this patent is extended or adjusted under 35 U.S.C. 154(b) by 341 days.

(21) Appl. No.: 10/352,758

(22) Filed: Jan. 28, 2003

(65) Prior Publication Data

US 2004/0145838 A1 Jul. 29, 2004

(51) Int. Cl.[7] .................. G01R 31/02; G01R 31/34
(52) U.S. Cl. ........................... 324/539; 324/772
(58) Field of Search ................ 324/539, 537, 324/771, 772, 503, 511

(56) References Cited

U.S. PATENT DOCUMENTS

| | | | |
|---|---|---|---|
| 3,604,949 A | 9/1971 | Conzelmann et al. | 327/89 |
| 4,827,897 A * | 5/1989 | Yamada et al. | 123/497 |
| 4,859,953 A * | 8/1989 | Young et al. | 324/539 |
| 5,017,910 A * | 5/1991 | Farber et al. | 340/635 |
| 5,081,404 A | 1/1992 | Kelley et al. | 318/434 |
| 5,166,852 A | 11/1992 | Sano | 361/42 |
| 5,173,832 A | 12/1992 | Giorgetta et al. | 361/88 |
| 5,341,265 A | 8/1994 | Westrom et al. | 361/44 |
| 5,469,825 A | 11/1995 | Golab et al. | 123/479 |
| 5,481,194 A | 1/1996 | Schantz et al. | 324/522 |
| 5,491,601 A | 2/1996 | Arntz | 361/79 |
| 5,508,872 A | 4/1996 | Khoo et al. | 361/42 |
| 5,561,380 A | 10/1996 | Sway-Tin et al. | 324/509 |
| 5,572,142 A | 11/1996 | Muraki | 324/546 |
| 5,638,247 A | 6/1997 | Loreck et al. | 361/191 |
| 5,737,711 A | 4/1998 | Abe | 701/29 |
| 5,784,245 A | 7/1998 | Moraghan et al. | 361/154 |
| 5,790,965 A | 8/1998 | Abe | 701/29 |
| 5,798,647 A * | 8/1998 | Martin et al. | 324/503 |
| 5,939,625 A | 8/1999 | Torii et al. | 73/118.1 |
| 5,957,985 A | 9/1999 | Wong et al. | 701/33 |
| 5,962,934 A | 10/1999 | Fendt et al. | 307/126 |
| 5,990,647 A | 11/1999 | Zettler | 318/483 |
| 6,028,431 A | 2/2000 | Hashida | 324/537 |
| 6,072,955 A | 6/2000 | Yokouchi et al. | 396/88 |
| 6,147,498 A | 11/2000 | Sumiya et al. | 324/415 |
| 6,222,374 B1 * | 4/2001 | Shoemaker | 324/537 |
| 6,281,631 B1 | 8/2001 | Schaffer et al. | 315/82 |
| 6,307,376 B1 | 10/2001 | Alexander et al. | 324/388 |
| 6,324,040 B1 | 11/2001 | Saladin et al. | 361/86 |
| 6,519,518 B1 | 2/2003 | Klein et al. | 701/41 |

* cited by examiner

*Primary Examiner*—Anjan Deb
(74) *Attorney, Agent, or Firm*—Jimmy L. Funke

(57) ABSTRACT

The present invention provides a system and method to passively monitor the performance of an electrical circuit designed to drive to a remote electric motor, including faults that occur intermittently. The invention is capable of identifying the location and type of malfunction in the event of the fault, using a fault verification operation. This includes implementing a predetermined operating mode using electrical circuits to the remote-drive electric motor, and monitoring continuously each of the inputs of the remote-drive electric motor, and communicating this information to an external controller.

17 Claims, 8 Drawing Sheets

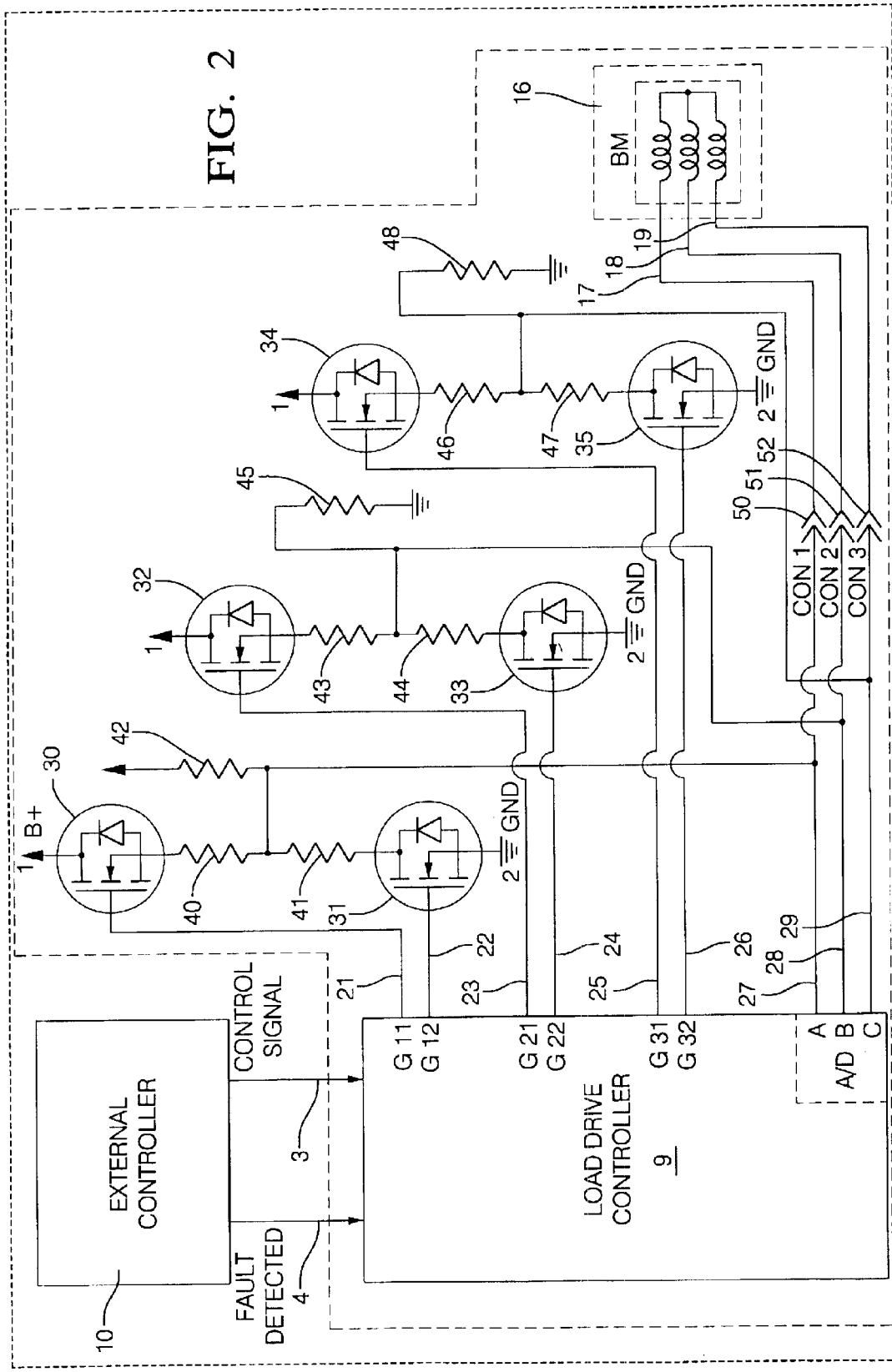

| $D_{21}$ | $D_{22}$ | $D_{23}$ | $D_{24}$ | $V_{27}$ | $V_{28}$ | FAULT STATUS AND POTENTIAL FAULTS |
|---|---|---|---|---|---|---|
| OFF | OFF | OFF | OFF | B+/2 | B+/2 | NO FAULTS-MOTOR DEACTIVATED |
| OFF | OFF | OFF | OFF | B+ | GND | CONNECTOR 50 OR CONNECTOR 51 - OC |
| OFF | OFF | OFF | OFF | B+ | B+ | CONNECTOR 50 OR CONNECTOR 51 - SC TO B+ |
| OFF | OFF | OFF | OFF | GND | GND | CONNECTOR 50 OR CONNECTOR 51 - SC TO GND |

FIG. 3A

| $D_{21}$ | $D_{22}$ | $D_{23}$ | $D_{24}$ | $V_{27}$ | $V_{28}$ | FAULT STATUS AND POTENTIAL FAULTS |
|---|---|---|---|---|---|---|
| ON | OFF | OFF | ON | B+ | GND | NO FAULTS-MOTOR DRIVEN FORWARD |
| ON | OFF | OFF | ON | B+ | B+ | CONNECTOR 51 - SC TO B+ |
| ON | OFF | OFF | ON | GND | GND | CONNECTOR 50 - SC TO GND |
| ON | OFF | OFF | ON | B+/2 | B+/2 | CONNECTOR 50 TO CONNECTOR 51 - SC |

FIG. 3B

| $D_{21}$ | $D_{22}$ | $D_{23}$ | $D_{24}$ | $V_{27}$ | $V_{28}$ | FAULT STATUS AND POTENTIAL FAULTS |
|---|---|---|---|---|---|---|
| OFF | ON | ON | OFF | GND | B+ | NO FAULTS-MOTOR DRIVEN IN REVERSE |
| OFF | ON | ON | OFF | B+ | B+ | CONNECTOR 51 - SC TO B+ |
| OFF | ON | ON | OFF | GND | GND | CONNECTOR 50 - SC TO GND |
| OFF | ON | ON | OFF | B+/2 | B+/2 | CONNECTOR 50 TO CONNECTOR 51 - SC |

FIG. 3C

| POTENTIAL FAULTS | $D_{21}$ | $D_{22}$ | $D_{23}$ | $D_{24}$ | EXPECTED $V_{27}$ | EXPECTED $V_{28}$ |
|---|---|---|---|---|---|---|
| CONNECTOR 50 - B+ | OFF | OFF | OFF | ON | B+ | GND |
| CONNECTOR 50 - GND | OFF | OFF | ON | OFF | GND | B+ |
| CONNECTOR 50 - OC | | | NO TEST | | | |
| CONNECTOR 51 - B+ | OFF | ON | OFF | OFF | GND | B+ |
| CONNECTOR 51 - GND | ON | OFF | OFF | OFF | B+ | GND |
| CONNECTOR 51 - OC | NO VERIFICATION TEST AVAILABLE | | | | | |
| CONNECTOR 50 TO CONNECTOR 51 - SC | NO VERIFICATION TEST AVAILABLE | | | | | |

FIG. 3D

| $D_{21}$ | $D_{22}$ | $D_{23}$ | $D_{24}$ | $D_{24}$ | $D_{24}$ | $V_{27}$ | $V_{28}$ | $V_{29}$ | FAULT STATUS AND POTENTIAL FAULTS |
|---|---|---|---|---|---|---|---|---|---|
| OFF | OFF | OFF | OFF | OFF | OFF | B+/3 | B+/3 | B+/3 | NO FAULTS-MOTOR DEACTIVATED |
| OFF | OFF | OFF | OFF | OFF | OFF | B+ | B+ | B+ | CONNECTOR 50, 51, OR 52: SC TO B+ |
| OFF | OFF | OFF | OFF | OFF | OFF | GND | GND | GND | CONNECTOR 50, 51, OR 52: SC TO GND |
| OFF | OFF | OFF | OFF | OFF | OFF | B+ | GND | GND | CONNECTOR 50 - OC |
| OFF | OFF | OFF | OFF | OFF | OFF | B+/2 | B+ | B+/2 | CONNECTOR 51 - OC |
| OFF | OFF | OFF | OFF | OFF | OFF | B+/2 | B+/2 | B+ | CONNECTOR 52 - OC |

FIG. 4A

| $D_{21}$ | $D_{22}$ | $D_{23}$ | $D_{24}$ | $D_{25}$ | $D_{26}$ | $V_{27}$ | $V_{28}$ | $V_{29}$ | FAULT STATUS AND POTENTIAL FAULTS |
|---|---|---|---|---|---|---|---|---|---|
| ON | OFF | OFF | ON | OFF | OFF | B+ | GND | B+/2 | NO FAULTS-MOTOR AT OPERATING POINT 1 |
| ON | OFF | OFF | ON | OFF | OFF | B+ | B+ | B+ | CONNECTOR 51 - SC TO B+ |
| ON | OFF | OFF | ON | OFF | OFF | B+ | GND | B+ | CONNECTOR 52 - SC TO B+, OR CONNECTOR 51 - OC, OR CONNECTOR 50 TO CONNECTOR 52 - SC |
| ON | OFF | OFF | OFF | OFF | OFF | GND | GND | GND | CONNECTOR 50 - SC TO GND |
| ON | OFF | OFF | ON | OFF | OFF | B+ | GND | GND | CONNECTOR 52 - SC TO GRD, OR CONNECTOR 52- OC, OR CONNECTOR 51 TO CONNECTOR 52 - SC, OR CONNECTOR 50 - SC |
| ON | OFF | OFF | OFF | OFF | ON | B+/2 | B+/2 | B+/2 | CONNECTOR 50 TO CONNECTOR 51 - SC |

FIG. 4B

| $D_{21}$ | $D_{22}$ | $D_{23}$ | $D_{24}$ | $D_{25}$ | $D_{26}$ | $V_{27}$ | $V_{28}$ | $V_{29}$ | FAULT STATUS AND POTENTIAL FAULTS |
|---|---|---|---|---|---|---|---|---|---|
| ON | OFF | OFF | OFF | ON | OFF | B+ | B+/2 | GND | NO FAULTS-MOTOR AT OPERATING POINT 2 |
| ON | OFF | OFF | OFF | ON | OFF | B+ | GND | GND | CONNECTOR 52 - OC, OR CONNECTOR 51 - SC TO B+, OR CONNECTOR 50 TO CONNECTOR 51 - SC |
| ON | OFF | OFF | OFF | ON | OFF | B+ | B+ | B+ | CONNECTOR 52 - SC TO B+ |
| ON | OFF | OFF | OFF | ON | OFF | GND | GND | GND | CONNECTOR 50 - SC TO GND |
| ON | OFF | OFF | OFF | ON | OFF | B+ | GND | GND | CONNECTOR 51 - SC TO GND, OR CONNECTOR 50 - OC, OR CONNECTOR 52 - SC, OR CONNECTOR 51 - OC |
| ON | OFF | OFF | OFF | OFF | ON | B+/2 | B+/2 | B+/2 | CONNECTOR 50 TO CONNECTOR 52 - SC |

FIG. 4C

| $D_{21}$ | $D_{22}$ | $D_{23}$ | $D_{24}$ | $D_{24}$ | $D_{24}$ | $V_{27}$ | $V_{28}$ | $V_{29}$ | FAULT STATUS AND POTENTIAL FAULTS |
|---|---|---|---|---|---|---|---|---|---|
| OFF | OFF | ON | OFF | OFF | ON | B+/2 | B+ | GND | NO FAULTS-MOTOR AT OPERATING POINT 3 |
| OFF | OFF | ON | OFF | OFF | ON | B+ | B+ | GND | CONNECTOR 50 - SC TO B+, OR CONNECTOR 50 - OC, OR CONNECTOR 52 - OC, OR CONNECTOR 50 TO CONNECTOR 51 - SC |
| OFF | OFF | ON | OFF | OFF | ON | B+ | B+ | B+ | CONNECTOR 52 - SC TO B+ |
| OFF | OFF | ON | OFF | OFF | ON | GND | B+ | GND | CONNECTOR 50 - SC TO GND, OR CONNECTOR 51 - OC, OR CONNECTOR 50 - TO CONNECTOR 52 - SC |
| OFF | OFF | ON | OFF | OFF | ON | GND | GND | GND | CONNECTOR 51 - SC TO GND |
| OFF | OFF | ON | OFF | OFF | ON | B+/2 | B+/2 | B+/2 | CONNECTOR 51 TO CONNECTOR 52 - SC |

FIG. 4D

| $D_{21}$ | $D_{22}$ | $D_{23}$ | $D_{24}$ | $D_{24}$ | $D_{24}$ | $V_{27}$ | $V_{28}$ | $V_{29}$ | FAULT STATUS AND POTENTIAL FAULTS |
|---|---|---|---|---|---|---|---|---|---|
| OFF | ON | ON | OFF | OFF | OFF | GND | B+ | B+/2 | NO FAULTS-MOTOR AT OPERATING POINT 4 |
| OFF | ON | ON | OFF | OFF | OFF | B+ | B+ | B+ | CONNECTOR 50 - SC TO B+, OR CONNECTOR 50 - OPEN CIRCUIT |
| OFF | ON | ON | OFF | OFF | OFF | GND | B+ | B+ | CONNECTOR 52 - SC TO B+, OR CONNECTOR 51 TO CONNECTOR 52 - SC |
| OFF | ON | ON | OFF | OFF | OFF | GND | GND | GND | CONNECTOR 51 - SC TO GND |
| OFF | ON | ON | OFF | OFF | OFF | GND | B+ | GND | CONNECTOR 52 - SC TO GND, OR CONNECTOR 51 - OC, OR CONNECTOR 52 OC, OR CONNECTOR 50 TO CONNECTOR 52 - SC |
| OFF | ON | ON | OFF | OFF | OFF | B+/2 | B+/2 | B+/2 | CONNECTOR 50 TO CONNECTOR 51 - SC |

FIG. 4E

| $D_{21}$ | $D_{22}$ | $D_{23}$ | $D_{24}$ | $D_{24}$ | $D_{24}$ | $V_{27}$ | $V_{28}$ | $V_{29}$ | FAULT STATUS AND POTENTIAL FAULTS |
|---|---|---|---|---|---|---|---|---|---|
| OFF | ON | ON | OFF | OFF | OFF | GND | B+/2 | B+ | NO FAULTS-MOTOR AT OPERATING POINT 5 |
| OFF | ON | ON | OFF | OFF | OFF | B+ | B+ | B+ | CONNECTOR 50 - SC TO B+, OR CONNECTOR 50 - OC |
| OFF | ON | ON | OFF | OFF | OFF | GND | B+ | B+ | CONNECTOR 51 - SC TO B+, OR CONNECTOR 51 TO CONNECTOR 52 - SC |
| OFF | ON | ON | OFF | OFF | OFF | GND | GND | B+ | CONNECTOR 51 - SC TO GND, OR CONNECTOR 51- OC, OR CONNECTOR 52 OC, OR CONNECTOR 50 TO CONNECTOR 51 - SC |
| OFF | ON | ON | OFF | OFF | OFF | GND | GND | GND | CONNECTOR 52 - SC TO GND |
| OFF | ON | ON | OFF | OFF | OFF | B+/2 | B+/2 | B+/2 | CONNECTOR 50 TO CONNECTOR 52 - SC |

FIG. 4 F

| $D_{21}$ | $D_{22}$ | $D_{23}$ | $D_{24}$ | $D_{24}$ | $D_{24}$ | $V_{27}$ | $V_{28}$ | $V_{29}$ | FAULT STATUS AND POTENTIAL FAULTS |
|---|---|---|---|---|---|---|---|---|---|
| OFF | OFF | OFF | ON | ON | OFF | B+/2 | GND | B+ | NO FAULTS-MOTOR AT OPERATING POINT 6 |
| OFF | OFF | OFF | ON | ON | OFF | B+ | GND | B+ | CONNECTOR 50 - SC TO B+, OR CONNECTOR 50 - OC, OR CONNECTOR 51 OC, OR CONNECTOR 50 TO CONNECTOR 52 - SC |
| OFF | OFF | OFF | ON | ON | OFF | B+ | B+ | B+ | CONNECTOR 52 - SC TO B+ |
| OFF | OFF | OFF | ON | ON | OFF | GND | GND | B+ | CONNECTOR 51 - SC TO GND, OR CONNECTOR 50 TO CONNECTOR 51 SC |
| OFF | OFF | OFF | ON | ON | OFF | GND | GND | GND | CONNECTOR 52 - SC TO GND, OR CONNECTOR 52- OC |
| OFF | OFF | OFF | ON | ON | OFF | B+/2 | B+/2 | B+/2 | CONNECTOR 51 TO CONNECTOR 52 - SC |

FIG. 4 G

| POTENTIAL FAULTS | $D_{21}$ | $D_{22}$ | $D_{23}$ | $D_{24}$ | $D_{25}$ | $D_{26}$ | $V_{27}$ | EXPECTED $V_{28}$ | EXPECTED $V_{29}$ |
|---|---|---|---|---|---|---|---|---|---|
| CONNECTOR 50 - B+ | OFF | OFF | OFF | ON | OFF | OFF | B+ | GND | B+/2 |
| CONNECTOR 50 - GND | OFF | OFF | ON | OFF | OFF | OFF | GND | B+ | B+/2 |
| CONNECTOR 50 - OC | OFF | OFF | OFF | ON | OFF | ON | B+ | GND | GND |
| CONNECTOR 51 - B+ | OFF | OFF | OFF | OFF | OFF | ON | B+/2 | B+ | GND |
| CONNECTOR 51 - GND | OFF | OFF | OFF | OFF | ON | OFF | B+/2 | GND | B+ |
| CONNECTOR 51 - OC | ON | OFF | ON | OFF | ON | OFF | B+ | GND | B+ |
| CONNECTOR 52 - B+ | OFF | ON | OFF | OFF | OFF | OFF | GND | B+/2 | B+ |
| CONNECTOR 52 - GND | ON | OFF | OFF | OFF | OFF | OFF | B+ | B+/2 | GND |
| CONNECTOR 52 - OC | ON | OFF | ON | OFF | OFF | OFF | B+ | B+ | GND |
| CONNECTOR 50 TO CONNECTOR 51 - SC | ON | OFF | OFF | ON | OFF | OFF | B+/2 | B+/2 | B+/2 |
| CONNECTOR 50 TO CONNECTOR 52 - SC | ON | OFF | OFF | OFF | OFF | ON | B+/2 | B+/2 | B+/2 |
| CONNECTOR 51 TO CONNECTOR 52 - SC | OFF | OFF | ON | OFF | OFF | ON | B+/2 | B+/2 | B+/2 |

FIG. 4 H

METHOD AND APPARATUS FOR CONTROL AND FAULT DETECTION OF A REMOTE ELECTRICAL MOTOR

INCORPORATION BY REFERENCE

Applicant incorporates by reference co-pending application U.S. Ser. No. 10/188,647 Method And Apparatus For Control And Fault Detection Of An Electric Load Circuit filed Jul. 2, 2002.

TECHNICAL FIELD

This invention relates to control and diagnosis of driver circuits and wiring harnesses for electrical load devices, including electromagnetic motors.

BACKGROUND OF THE INVENTION

Electrical loads that require multi-pole control of electrical current, e.g. electric motors, are used in a variety of applications in industrial controls, motor vehicles and other devices. Industrial applications include, for example, robotics devices and electrically controlled pumps for chemical process systems. Vehicle applications may include, for example, electronic throttle control actuators and cruise control actuators. Often these motors are remotely mounted away from a load controller and a driver circuit, with a wiring harness providing electrical power connection. These devices often require diagnostic capabilities to detect fault conditions and to assist in troubleshooting problems and repairing the system.

A circuit for controlling an electric motor may also be used to monitor performance of the device. When a fault occurs in a circuit, the effect in an industrial setting is machine downtime and a resulting loss in productivity. The effect on a motor vehicle includes a loss in system performance, damage to related systems and components, or an increase in emissions of the vehicle. The increase in emissions has become important with the advent of government regulations that compel addition of on-board vehicle diagnostic systems to monitor emissions related components and control systems. The intent of the on-board diagnostic systems is to detect faults that lead to emissions increases.

There is a need to identify a specific location of a fault or malfunction once it has been detected to ensure that a fault is quickly located and effectively repaired. This need to identify the location of a fault is important to minimize a loss of productivity associated with machine downtime in a factory, or to minimize costs to diagnose and repair a system on a vehicle.

When a fault occurs in a system, there is a need to identify the type and location of the fault to facilitate repair. When a fault occurs on a vehicle a diagnostic fault indicator may be set. This fault indicator typically identifies the system wherein a fault has occurred, but lacks sufficient specificity to identify where a specific repair needs to occur. The diagnostic fault indicator leads a repair technician to a system whose performance may be affected by interactions between several components or subsystems. The technician may be compelled to work through multiple diagnostic procedures to locate and repair the fault. This consumes time and resources, and results in increased cost and decreased satisfaction to the vehicle owner. A further outcome may be that a diagnostic code leads a technician to replace a motor, when the needed repair was the replacement or repair in a wiring harness leading to the motor.

The ability to correctly detect and identify a fault is more difficult when the fault is intermittent, as may occur when there is water intrusion into a wiring harness or connector. A technician spends time and resources in attempting to reproduce fault conditions to identify a fault or verify a repair. This results in customer dissatisfaction and high costs to the customer or the manufacturer, due to multiple attempts to identify and repair intermittent faults in a circuit. This problem is apparent when a fault occurs that sets a general diagnostic code that lacks sufficient specificity to identify a needed repair.

Electrical wiring harnesses may include devices such as insulated wires, connectors, drive transistors or relays, wiring junctions, and fuses. There are also electronic devices available called 'intelligent drivers' or 'intelligent switches' used to drive a motor. A fault in the wiring harness that may lead to incomplete operation of an electric load system includes wiring harness shorts to ground, wiring harness open circuits, and wiring harness intermittent connections. Other faults include broken or abraided wires, and connector faults such as relaxation of terminals, or corrosion due to intrusion of water or contaminants.

There are standard methods existing to diagnose and repair faults using off-board techniques such as connectivity tests and diagnostic trouble trees. These methods and tools are contained in service manuals, and are well known in the art. Off-board techniques require the employment of intrusive test methods, including the use of hand held scan tools used by a skilled technician.

There are electronic devices available on the market today called 'intelligent drivers' or 'intelligent switches' that have the capability to detect some open circuit and short circuit conditions but not all the conditions covered by this invention. A significant improvement offered by this invention is that most open circuit and short-circuit conditions are detected before the circuit is activated and also suggest the location of the fault.

The prior art diagnoses faults in electrical load circuits on-board the vehicle through the addition of current-monitoring devices that add cost and complexity to the circuit. The prior art has also used the intelligent drivers and intelligent switches to detect some open circuit and short circuit conditions. The prior art also identifies the presence and location of faults with on-board intrusive methods and systems that send a signal through the circuit to the motor, and look for a subsequent output from the motor. Each of these methods is disruptive when occurring during normal operation of the vehicle or the system. The prior art also does not address the issue of identifying the presence of an intermittent fault in a circuit, and the related result of being able to focus the repair efforts of a technician to a specific location in the system. The prior art also does not provide any capability of detecting a fault prior to powering the motor. Other methods have been limited in the range of diagnostic capabilities. Hence, there is a need to identify and diagnose a malfunction in a wiring harness for a remote mounted motor, and to perform the diagnostic prior to activating the wiring harness.

SUMMARY OF THE INVENTION

The present invention is an improvement over conventional electric circuit monitoring devices in that it provides a system and method to passively monitor the performance of an electrical circuit that is designed to drive to an electric motor, including faults that occur intermittently. The invention is capable of identifying the location and type of malfunction in the event of the fault. Accordingly, the invention provides a complete apparatus and method to control and diagnose faults in driver circuits used to drive a remote-drive electric motor having a plurality of inputs. This includes implementing a predetermined operating mode using electrical circuits to the remote-drive electric motor, and monitoring continuously each of the inputs of the remote-drive electric motor. This also includes continuous monitoring regardless of whether the operating mode is on or off, or neutral, or the direction of operation. It also includes a method and system to verify the fault based upon the inputs when the controller implements a fault verification operation. The invention also includes being able to identify the type and location of a fault, and communicate this information to an external controller.

The present invention also provides a system to detect a fault in a wiring harness of a remote-drive electric motor, including a controller with an analog-to-digital converter, output drivers, and communications to an external controller. Each of the output drivers is operably connected to an electrical circuit that corresponds to one of the inputs of the remote-drive electric motor. The inputs of the remote-drive electric motor are input to the analog-to-digital converter. The controller is operable to control the remote-drive electric motor with the output drivers and also monitor the inputs of the remote-drive electric motor. These and other features of the invention will become apparent to those skilled in the art upon reading and understanding the following detailed description of the embodiments.

BRIEF DESCRIPTION OF THE DRAWINGS

The invention may take physical form in certain parts and arrangement of parts, the preferred embodiment of which will be described in detail and illustrated in the accompanying drawings which form a part hereof, and wherein:

FIG. 2 is a second schematic diagram of a circuit for controlling and diagnosing an electric motor, in accordance with the present invention;

FIGS. 3(a)–3(d) are tables, in accordance with the present invention; and

FIGS. 4(a)–4(h) are also tables, in accordance with the present invention.

DETAILED DESCRIPTION OF THE INVENTION

Figure 1:
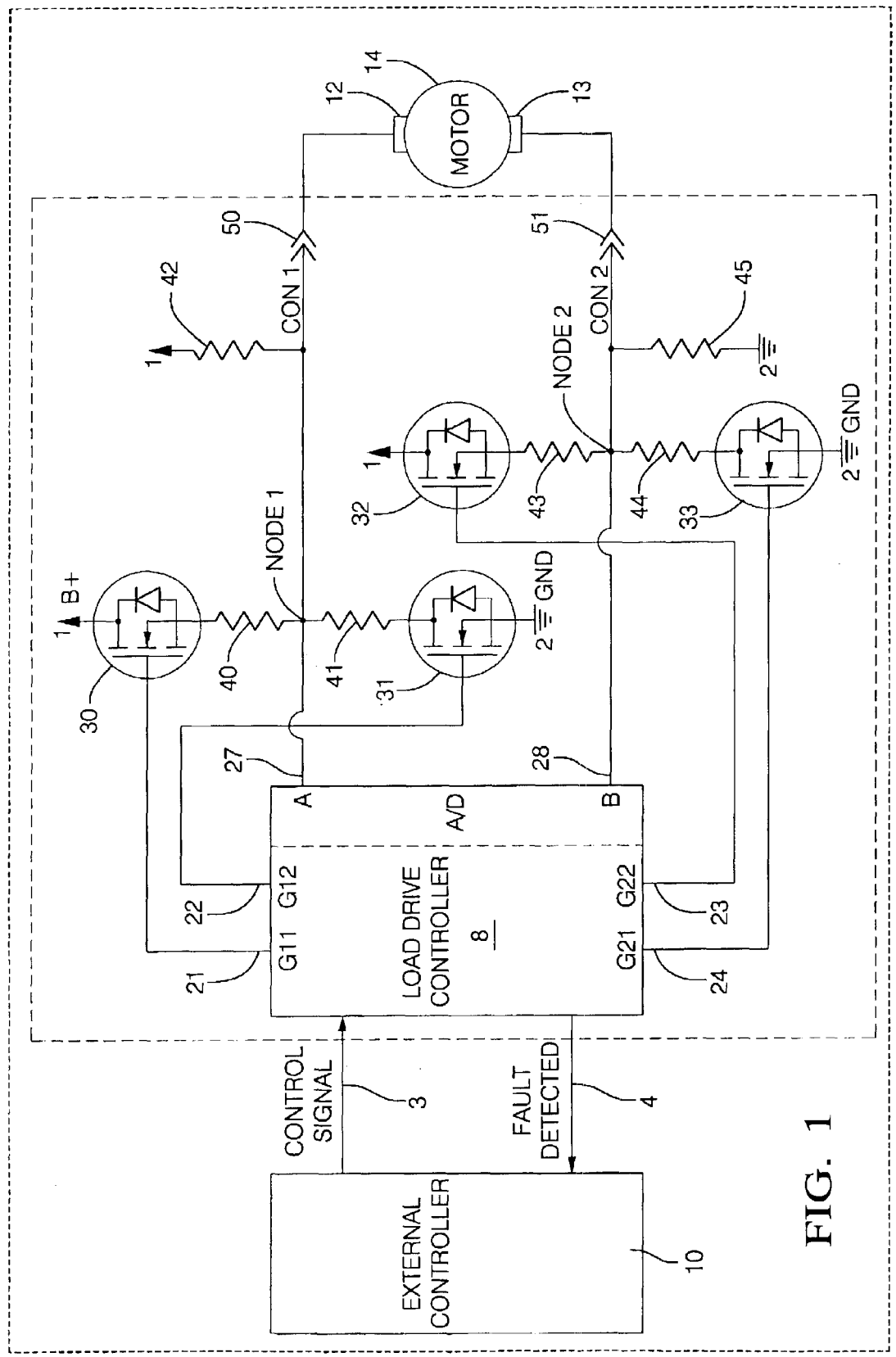
FIG. 1 is a schematic diagram of a circuit for controlling and diagnosing an electric motor, in accordance with the present invention.

Referring now to the drawings, wherein the showings are for the purpose of illustrating the preferred embodiment of the invention only and not for the purpose of limiting the same, FIG. 1 shows a schematic diagram of an electrical driver circuit 5 for control and diagnosis of an bipolar electric motor 14 that has been constructed in accordance with the present invention. The electrical driver circuit 5 is comprised of a first load drive controller 8 that is electrically connected to the bipolar electric motor 14 using a wiring harness.

The first load drive controller 8 is preferably a digital electronic controller that is operable to communicate bi-directionally with an external controller 10. In this embodiment, the first load drive controller 8 is comprised of an analog-to-digital converter (not shown) that collects and processes information from electrical signals, preferably from a first input 27 and a second input 28 from the wiring harness. The first input 27 and second input 28 provide measures of electrical potential delivered to corresponding ends 12, 13 of a bi-polar motor 14. The first load drive controller 8 is also comprised of four output drivers 21, 22, 23, 24, each which correspond to one of four switches 30, 31, 32, 33 in the wiring harness. Each of the four output drivers 21, 22, 23, 24 is operable to control one of the four switches 30, 31, 32, 33. The first load drive controller 8 is also preferably comprised of a bi-directional signal line that accepts an electronic control signal 3, and sends a fault signal 4 to the external controller 10. The fault signal 4 is preferably an electronic communications signal that is sent to the external controller 10 and comprises the first input 27 and second input 28 to the analog-to-digital converter. The design and implementation of digital electronic controllers, with output drivers, an analog-to-digital converter, and bi-directional communications is known to one skilled in the art.

The first end 12 of the bipolar electric motor 14 is electrically connected to a first connector 50, which is electrically connected to a first electrical circuit and the first input 27 of the first load drive controller 8. The second end 13 of the bipolar electric motor 14 is electrically connected to a second connector 51, which is electrically connected to a second electrical circuit and the second input 28 of the first load drive controller 8. The first electrical circuit comprises the first switch 30 and a first resistor 40 serially electrically connected between a first electric potential 1 and the first connector 50. The second switch 31 and a second resistor 41 are serially electrically connected between the first connector 50 and a second electric potential 2. There is a third resistor 42 electrically parallel to the first switch 30 and the first resistor 40. The electrical potential to the first connector 50 also becomes the first input 27 to the first load drive controller 8, as described previously. The second electrical circuit comprises the third switch 32 and a fourth resistor 40 serially electrically connected between the first electric potential 1 and the second connector 51. The fourth switch 33 and a fifth resistor 44 are serially electrically connected between the second connector 51 and the second electric potential 2. There is also a sixth resistor 45 electrically parallel to the fourth switch 33 and the fifth resistor 44. The electrical potential to the second connector 51 also becomes a second input 28 to the first load drive controller 8. In this embodiment, the first electric potential 1 is preferably battery voltage ('B+') and the second electric potential 2 is preferably electrical ground ('Gnd').

The switches 30, 31, 32, 33 are each preferably field-effect transistors. The first, second, fourth, and fifth resistors 40, 41, 43, 44 are selected to be about 1/100 of the resistance of the bipolar electric motor, or in the range of 0.1 Ω. The third and sixth resistors 42, 45 are about 100 times the resistance of the bipolar electric motor, or in the range of 10 kΩ.

Referring now to FIG. 2, a schematic diagram is shown of an second electrical driver circuit 6 for control and diagnosis of a three-pole electric motor 16 that has been constructed in accordance with the present invention. The second electrical driver circuit 6 is comprised of a second load drive controller 9 that is electrically connected to the three pole electric motor 16 using a wiring harness. Elements of the circuit in FIG. 2 that are analogous to elements in FIG. 1 are given the same number designation.

The second load drive controller 9 is a digital electronic controller that is operable to communicate bi-directionally with the external controller 10. In this embodiment, the second load drive controller 9 is comprised of an analog-to-digital converter that collects and processes information from electrical signals, preferably from the first and second inputs 27, 28 and a third input 29 from the wiring harness. In this embodiment, the first input 27, second input 28, and third input 29 provide measures of electrical potential delivered to corresponding ends 17, 18, and 19 of the three-pole motor 16. The second load drive controller 9 is also comprised of six output drivers 21, 22, 23, 24, 25, and 26, each which correspond to one of six switches 30, 31, 32, 33, 35, and 36 in the wiring harness. Each of the six output drivers 21, 22, 23, 24, 25, and 26 is operable to control one of the six switches 30, 31, 32, 33, 34, 35. The second load drive controller 9 is also preferably comprised of the bi-directional signal line that accepts the electronic control signal 3, and sends the fault signal 4 to the external controller 10. The fault signal 4 is preferably an electronic communications signal that is sent to the external controller 10 and comprises the first, second, and third inputs 27, 28, and 29 to the analog-to-digital converter. The design and implementation of digital electronic controllers, with output drivers, an analog-to-digital converter, and bi-directional communications is known to one skilled in the art.

The first end 17 of the three-pole electric motor 16 is electrically connected to the first connector 50, which is electrically connected to the first electrical circuit and the first input 27 to the second load drive controller 9. The second end 18 of the three-pole electric motor 16 is electrically connected to the second connector 51, which is electrically connected to the second electrical circuit and the second input 28 of the second load drive controller 9. The third end 19 of the three-pole electric motor 16 is electrically connected to the third connector 52, which is electrically connected to the third electrical circuit and the third input 29 of the second load drive controller 9. The design and implementation of three-pole electric motors is known to one skilled in the art.

The first electrical circuit and the second electrical circuit are comprised as described previously with respect to FIG. 1. The third electrical circuit is comprised of a fifth switch 34 and a seventh resistor 46 serially electrically connected between the first electric potential 1 and the third connector 52. There is a sixth switch 35 and an eighth resistor 47 serially electrically connected between the third connector 52 and the second electric potential 2. There is also a ninth resistor 48 electrically parallel to the fifth switch 34 and seventh resistor 46. In this embodiment, the first electric potential 1 is battery voltage and the second electric potential 2 is ground. Again, the switches 30, 31, 32, 33, 34 and 35 are each preferably field-effect transistors.

The seventh and eighth resistors 46, 47 are selected to be about 1/100 of the resistance of the three-pole electric motor, or in the range of 0.1 Ω. The ninth resistor 48 is set equal to the third and sixth resistors 42, 45, and is about 100 times the resistance of the three-pole electric motor, or in the range of 10 kΩ. The electrical circuits described herein also contain other elements (not shown) to accommodate electrical noise, including internally generated noise due to switching or from an external source. The circuits may also contain additional elements (not shown) that enable assembly and operation. These additional elements (not shown), and the design and implementation of electrical circuits are known to one skilled in the art.

The electrical driver circuits 5 and 6 described hereinabove may also contain other elements (not shown) to accommodate electrical noise, including internally generated noise due to switching or from an external source. The circuits 5 and 6 may also contain additional elements (not shown) that enable assembly and operation, including additional connectors, splices, or fusible links, for example. These additional elements (not shown), and the design and implementation of electrical circuits are known to one skilled in the art.

Referring again to the bipolar motor and control device in FIG. 1, the controller 8 is operable to perform fault detection in the wiring harness and motor during normal operation and a fault verification operation. The normal operation is comprised of three predetermined operating modes, including an off mode, a forward mode, and a reverse mode. Operation of a bi-polar electrical motor is generally known to one skilled in the art, and only details specific to the invention are detailed hereinafter.

During the off mode, each of the four output drivers 21, 22, 23, 24 is commanded off by the controller 8, which means that each of the four switches 30, 31, 32, 33 are also off. The controller 8 monitors each of the input voltages. If no electrical fault is detected in the motor drive circuit, both the input voltages 27, 28 are at or near one half battery voltage B+, due to a voltage divider circuit that is effectively created by the third resistor 42 and the sixth resistor 45. If there are any faults in the circuit, the input voltages 27, 28 provide an indication of the likely location of the fault. These results are further detailed in FIG. 3(a), wherein $D_{XX}$ refers to the digital signal from the controller 8 to each respective driver, which is designated by its respective number XX, and $V_{YY}$ refers to the input voltage of the respective input device, as measured by the controller and designated by its respective number YY. Detectable faults include open circuit ('OC') and short circuit ('SC'), to battery voltage ('B+'), and ground ('Gnd'). The controller 8 is operable to monitor for faults during each of the predetermined modes, and communicate the result to the external controller 10.

During the forward mode, the controller 8 commands the output drivers 21 and 24 on. The signal from output driver 21 is fully on, whereas the signal from output driver 24 is preferably pulsewidth-modulated by the load drive controller 8, at a rate that is appropriate for the specific motor and operating system. The signal from output drivers 22 and 23 are both off. This results in switch 30 being on, switch 33 being pulsewidth modulated on and off, and switches 31 and 32 being off. If switch 33 is on, and there are no electrical faults in the motor drive circuit, the input voltage 27 is at the battery voltage 1 and the input voltage 28 is at ground 2. If there are any faults in the circuit, the input voltages 27, 28 provide an indication of the likely location of the fault. This is shown in FIG. 3(b), wherein $D_{XX}$ refers to the digital signal from the controller 8 to each respective driver, which is designated by its respective number XX, and $V_{YY}$ refers to the input voltage to the respective input device, designated by its respective number YY.

During the reverse mode, the controller 8 commands the output drivers 21 and 24 off. The signal from output driver 22 is fully on, whereas the signal from output driver 23 is preferably pulsewidth-modulated by the load drive controller 8, again, at a rate that is appropriate for the specific motor and operating system. This results in switches 30 and 33 being off, and switch 31 is on, and switch 32 is pulsewidth-modulated on and off. If switch 33 is on and there are no electrical faults in the motor drive circuit, the input voltage 27 is at ground 2, and the input voltage 28 is at or near battery voltage 1. If there are any faults in the circuit, the input voltages 27, 28 provide an indication of the likely location of the fault. This is shown in FIG. 3(c), wherein $D_{XX}$ refers to the digital signal from the controller 8 to each respective driver, which is designated by its respective number XX, and $V_{YY}$ refers to the input voltage to the respective input device, designated by its respective number YY.

Potential fault conditions that are detected by the instant invention shown in FIG. 1 include the following:

| Definitions of Potential Fault Conditions: | |
|---|---|
| Connector 51 - B+ | Wire connected to Connector 51 shorted to B+ |
| Connector 51 - Gnd | Wire connected to Connector 51 shorted to Gnd |
| Connector 51 - OC | Open-circuit in Connector 51, or in wire connected to Connector 51, or open-circuit inside motor 14 |
| Connector 52 - B+ | Wire connected to Connector 52 shorted to B+ |
| Connector 52 - Gnd | Wire connected to Connector 52 shorted to Gnd |
| Connector 52 - OC | Open-circuit in Connector 52, or in wire connected to Connector 52, or open-circuit inside motor 14 |
| Connector 51 to Connector 52 - SC | Short-circuit between Connector 51 and Connector 52 or short-circuit inside motor 14 |

During the fault verification operation, the controller 8 verifies the presence of the fault by performing a verification operation, as shown in FIG. 3(d). FIG. 3(d) shows, for a given potential fault, input voltages $V_{27}$ and $V_{28}$ that are expected in response to specific outputs of drivers 21, 22, 23, 24. In the fault verification operation, the load drive controller 8 determines a fault status, each of which have been previously described with respect to FIGS. 3(a)-3(c). The controller 8 then commands the output drivers 21, 22, 23, 24, as described in FIG. 3(d), in reference to a specifically identified fault, and monitors the input voltages $V_{27}$ and $V_{28}$. If the measured input voltages $V_{27}$ and $V_{28}$ substantially match the expected input voltages, the load drive controller 8 communicates to the external controller 10 that a fault has occurred, as identified with regard to FIGS. 3(a)-3(c). If the measured input voltages $V_{27}$ and $V_{28}$ do not substantially match the expected input voltages, it is an unverified fault. The controller 8 still communicates to the external controller 10 that a fault has occurred, as identified with regard to FIGS. 3(a)-3(c). However, the load drive controller 8 also preferably communicates that the identified fault is an unverified fault. In so doing, the information that the identified fault is an unverified fault is useful to identify the presence of an intermittent fault.

Referring again to the three-pole motor and control device in FIG. 2, controller 9 is operable to perform fault detection of the wiring harness and motor 16 during normal operation and fault verification operation. The normal operation of the three-pole motor 16 is comprised of three predetermined operating modes, including an off mode, a forward mode, and a reverse mode. Operation of a three-pole electrical motor is generally known to one skilled in the art, and only details specific to the invention are detailed hereinafter.

During the off mode, each of the six output drivers 21, 22, 23, 24, 25, 26 are commanded off by the controller 9, which means that each of the six switches 30, 31, 32, 33, 34, 35 are also off. If there are no electrical faults in the wiring harness, all three of the input voltages 27, 28, 29 are at or near one third of the first electrical potential 1, due to a voltage divider circuit that is effectively created by the third resistor 42, the sixth resistor 45, and the ninth resistor 48. This result is shown in the first line of FIG. 4(a). If there are any faults in the wiring harness, the input voltages 27, 28, 29 provide an indication of the likely location of the fault. This is shown in subsequent lines of FIG. 4(a), wherein $D_{XX}$ refers to the digital signal from the controller 9 to each respective driver, which is designated by its respective number XX, and $V_{YY}$ refers to the input voltage to the respective input device, designated by its respective number YY.

Potential fault conditions that are detected by the instant invention shown in FIG. 2 include the following:

| Definitions of Possible Fault Conditions: | |
|---|---|
| Connector 51 - B+ | Wire connected to Connector 51 shorted to B+ |
| Connector 51 - Gnd | Wire connected to Connector 51 shorted to Gnd |
| Connector 51 - OC | Open-circuit in Connector 51, or in wire connected to Connector 51, or open-circuit inside motor 16 |
| Connector 52 - B+ | Wire connected to Connector 52 shorted to B+ |
| Connector 52 - Gnd | Wire connected to Connector 52 shorted to Gnd |
| Connector 52 - OC | Open-circuit in Connector 52, or in wire connected to Connector 52, or open-circuit inside motor 16 |
| Connector 53 - B+ | Wire connected to Connector 53 shorted to B+ |
| Connector 53 - Gnd | Wire connected to Connector 53 shorted to Gnd |
| Connector 53 - OC | Open-circuit in Connector 53, or in wire connected to Connector 53, or open-circuit inside motor 16 |
| Connector 51 to Connector 52 - SC | Short-circuit between Connector 51 and Connector 52 or short-circuit inside motor 16 |
| Connector 51 to Connector 53 - SC | Short-circuit between Connector 51 and Connector 53 or short-circuit inside motor 16 |
| Connector 52 to Connector 53 - SC | Short-circuit between Connector 52 and Connector 53 or short-circuit inside motor 16 |

During the forward mode, the controller 10 repeatedly sequentially commands six predetermined operating points 1, 2, 3, 4, 5, and 6, in a specific order. The specific order is predetermined based upon motor design, wiring harness design and controller design, and is known to one skilled in the art. The six predetermined operating points 1, 2, 3, 4, 5, and 6 correspond to specific combinations of operation for the output drivers to drive the three-pole motor. Each of the six possible points of normal operation comprise activating two of the three electrical circuits by closing one of two switches in each circuit, and deactivating the third electrical circuit by keeping open both switches in the third electrical circuit. Referring now to line 1 of FIG. 4(b), and as an example, the controller 9 activates the two output drivers 21, 24. The signal from output driver 21 is fully on, whereas the signal from output driver 24 is preferably pulsewidth-modulated by the controller 9, again at a rate that is appropriate for the specific motor and operating system. The signal from output drivers 22, 23, 25 and 26 are all off. This results in switch 30 being on, switch 33 being pulsewidth-modulated on and off, and switches 31, 32, 34, and 35 being off. In this example, if switch 33 is on and there are no electrical faults in the motor drive circuit, the input voltage 27 is at the battery voltage 1, the input voltage 28 is at ground 2, and input voltage 29 is about half the battery voltage 1.

If there are any faults in the wiring harness, the input voltages 27, 28, and 29 provide an indication of the likely location of the fault. These results are shown in lines 2–6 of FIG. 4(b), below, wherein $D_{XX}$ refers to the digital signal from the controller 9 to each respective driver, which is designated by its respective number XX, and $V_{YY}$ refers to the input voltage to the respective input device, designated by its respective number YY.

Referring now to FIGS. 4(c)–4(g), the other five possible points of normal operation of the three-pole electric motor 16 are shown, with results for normal operation and for potential faults. Again, $D_{XX}$ refers to the digital signal from the controller 9 to each respective driver, which is designated by its respective number XX, and $V_{YY}$ refers to the input voltage to the respective input device, designated by its respective number YY.

During the fault verification operation, the controller 9 verifies the presence of a fault, by performing fault verification, as shown in FIG. 4(h). FIG. 4(h) shows, for a given potential fault, input voltages $V_{27}$, $V_{28}$, and $V_{29}$ that are expected in response to specific outputs of drivers 21, 22, 23, 24, 25, and 26. In fault verification, the controller 9 determines a fault status, each of which have been previously described with respect to FIG. 4(a)–4(g). The controller 9 then commands the output drivers 21, 22, 23, 24, 25, and 26 as described in FIG. 4(h), with reference to a specifically identified fault, and monitors the input voltages $V_{27}$, $V_{28}$, and $V_{29}$. If the measured input voltages $V_{27}$, $V_{28}$, and $V_{29}$ substantially match the expected inputs, the fault has been verified. The controller 9 communicates the fault to the external controller 10. If the measured input voltages $V_{27}$, $V_{28}$, and $V_{29}$ do not substantially match the expected input voltages, it is an unverified fault. The controller 9 still communicates to the external controller 10 that a fault has occurred, as identified with regard to FIG. 4(a)–4(g). However, the controller 9 also preferably communicates that the identified fault is an unverified fault. In so doing, the information that the identified fault is an unverified fault is useful to identify presence of an intermittent fault.

The invention may be used to monitor electric motor devices in vehicle systems including, inter alia, fans, fuel pumps, and electronic throttle control devices.

System requirements, circuit design factors or communications protocols may drive the designer to configure the circuit differently. For example, the load drive controller 9 may be up-integrated into the external controller 10; the outputs 27, 28, 29 may be communicated directly to the external controller 10; the control signal 3 and fault detected signal 4 can be combined using a bi-directional communications method; or, the load drive controller may have other diagnostic and control capabilities in addition to those mentioned in the invention. In addition, some or all of the elements of the circuit 5 may be integrated into the external controller 10. The components of circuit may or may not be discrete elements.

The switches 30–35 may also be bipolar transistors, electromagnetic relays, or other devices. The circuit may also contain one or more electrical connectors, conductive wire (not detailed), electrical splices (not shown), junction boxes (not shown) or other devices used in connecting load devices to electrical power in a system. The use of alternative devices to switch is known to one skilled in the art.

Circuit design factors and communications protocols may also lead to implementation of alternative designs of electrical driver circuits. Alternative designs of electrical circuits for driving multi-pole motors are encompassed in this invention, insofar as they employ the system and method described herein. For example, the inputs to the comparators can be reconfigured to provide different outputs in response to control signal inputs.

The invention has been described with specific reference to the preferred embodiments and modifications thereto. Further modifications and alterations may occur to others upon reading and understanding the specification. It is intended to include all such modifications and alterations insofar as they come within the scope of the invention.

What is claimed is:

1. A method for detecting a fault in a wiring harness of a remote-drive electric motor having a plurality of inputs, comprising:

implementing a system comprising a controller electrically operably connected to a plurality of output drivers, electrically signally connected to a plurality of inputs to the remote-drive electric motor, the plurality of output drivers electrically operably connected to one of the plurality of inputs to the remote-drive electric motor, and, a plurality of resistors, each resistor electrically connected to one of the plurality of inputs of the remote-drive electric motor;

implementing a predetermined operating mode using the plurality of output drivers to the remote-drive electric motor; and monitoring continuously electrical potential of each of the plurality of inputs of the remote-drive electric motor, based upon the plurality of resistors.

2. The method of claim 1, wherein monitoring continuously each of the plurality of inputs includes monitoring when the predetermined operating mode is an off mode.

3. The method of claim 1, wherein monitoring continuously each of the plurality of inputs of the remote-drive electric motor comprises comparing each of the plurality of inputs to each of a correspondingly expected plurality of inputs.

4. The method of claim 1, further comprising verifying the potential fault by executing a fault verification operation.

5. The method of claim 4, wherein executing the fault verification operation comprises:

commanding a predetermined operating mode that corresponds to the potential fault;

monitoring each of the plurality of inputs to the remote-drive electric motor;

comparing each of the plurality of inputs to the remote-drive electric motor to each of a correspondingly expected plurality of inputs, and obtaining a result of the comparison of each of the plurality of inputs to the remote-drive electric motor to each of the correspondingly expected plurality of inputs.

6. The method of claim 5, further comprising detecting a presence of an intermittent fault when at least one of the plurality of inputs does not substantially match at least one of the correspondingly expected plurality of inputs.

7. The method of claim 5, further comprising communicating the result of the comparison each of the plurality of inputs to the remote-drive electric motor to each of the correspondingly expected plurality of inputs to an external controller.

8. A system to detect a fault in a wiring harness of a remote-drive electric motor having a plurality of inputs, comprising:

a controller: electrically operably connected to a plurality of output drivers, electrically signally connected to a plurality of inputs to the remote-drive electric motor, the plurality of output drivers electrically operably connected to one of the plurality of inputs to the remote-drive electric motor; and, a plurality of resistors, each resistor electrically connected to one of the plurality of inputs of the remote-drive electric motor;

wherein the controller is operable to control the remote-drive electric motor with the plurality of output drivers; and, operable to continuously monitor electrical potential of each of the plurality of inputs of the remote-drive electric motor, based upon the plurality of resistors.

9. The system of claim 8, further comprising the controller operable to verify the fault based upon the plurality of inputs when the controller implements a fault verification operation.

10. The system of claim 9, wherein the controller implements the fault verification operation comprises the controller operable to:

command a predetermined operating mode that corresponds to the potential fault, using the plurality of electrical circuits;

monitor each of the plurality of inputs to the remote-drive electric motor;

compare each of the plurality of inputs to the remote-drive electric motor to an expected plurality of inputs contained in the controller;

obtain a result of the comparison of each of the plurality of inputs to the remote-drive electric motor to the expected plurality of inputs; and communicate the result of the comparison of each of the plurality of inputs to the remote-drive electric motor to the expected plurality of inputs to an external controller.

11. The system of claim 10, wherein the remote-drive electric motor comprises a two-pole brush motor.

12. The system of claim 10, wherein the remote-drive electric motor comprises a three-pole brushless motor.

13. The system of claim 10, wherein the predetermined operating mode comprises normal operation of the remote-drive electric motor.

14. The system of claim 10, wherein the fault verification operation comprises an intrusive operation.

15. The system of claim 10, wherein the predetermined operating mode includes off operation of the remote-drive electric motor.

16. The system of claim 8, wherein each of the plurality of resistors has an impedance about one hundred times the resistance of the bipolar electric motor.

17. A system to detect a fault in a wiring harness of a remote-drive electric motor with a plurality of inputs, comprising:

a controller including an analog-to-digital converter with a plurality of inputs, and electrically operably connected to a plurality of output drivers, electrically signally connected to the plurality of inputs to the remote-drive electric motor, and a device for communicating to an external controller;

said plurality of output drivers operably connected to one of the plurality of inputs of the remote-drive electric motor;

a plurality of resistors, each resistor electrically connected to one of the plurality of inputs of the remote-drive electric motor;

said each of the plurality of inputs are input to the analog-to-digital converter;

wherein the controller is operable to control the remote-drive electric motor with the plurality of output drivers and operable to continuously monitor electrical potential of each of the plurality of inputs of the remote-drive electric motor, based upon the plurality of resistors.

* * * * *